(12) United States Patent
Chien et al.

(10) Patent No.: US 12,094,727 B2
(45) Date of Patent: Sep. 17, 2024

(54) METHOD FORMING A SEMICONDUCTOR PACKAGE DEVICE

(71) Applicant: Silicon Motion, Inc., Jhubei (TW)

(72) Inventors: Yi-Hung Chien, Kaohsiung (TW); Chun-Ying Wang, Zhubei (TW); Te-Wei Chen, Zhubei (TW); Hsiu-Yuan Chen, Zhubei (TW); Bing-Ling Wu, Zhubei (TW)

(73) Assignee: SILICON MOTION, INC., Jhubei (TW)

( * ) Notice: Subject to any disclaimer, the term of this patent is extended or adjusted under 35 U.S.C. 154(b) by 493 days.

(21) Appl. No.: 17/568,167

(22) Filed: Jan. 4, 2022

(65) Prior Publication Data

US 2023/0062499 A1    Mar. 2, 2023

(30) Foreign Application Priority Data

Aug. 25, 2021   (TW) .................. 110131380

(51) Int. Cl.
*H01L 21/48* (2006.01)
*H01L 21/56* (2006.01)
*H01L 23/00* (2006.01)

(52) U.S. Cl.
CPC ...... *H01L 21/4878* (2013.01); *H01L 21/4857* (2013.01); *H01L 21/563* (2013.01); *H01L 21/565* (2013.01); *H01L 21/561* (2013.01); *H01L 24/95* (2013.01)

(58) Field of Classification Search
CPC ... H01L 23/3735–3737; H01L 21/4882; H01L 21/6836; H01L 21/563; H01L 21/565; H01L 24/96–9; H01L 2924/18161; H01L 2224/97; H01L 23/28; H01L 23/36; H01L 23/3636; H01L 23/3107; H01L 23/3157; H01L 23/3185; H01L 23/3192; H01L 23/3135; H10N 30/088
See application file for complete search history.

(56) References Cited

U.S. PATENT DOCUMENTS

| | | |
|---|---|---|
| 2010/0105170 A1 | 4/2010 | Sato et al. |
| 2014/0299980 A1 | 10/2014 | Choi et al. |
| 2017/0040249 A1 | 2/2017 | Yanagisawa et al. |
| 2020/0006176 A1* | 1/2020 | Tsai ...................... H01L 23/562 |

* cited by examiner

*Primary Examiner* — Jose R Diaz

(74) *Attorney, Agent, or Firm* — McClure, Qualey & Rodack, LLP

(57) ABSTRACT

A method forming a semiconductor package device includes: providing a substrate; forming a flip chip die on a first side on the substrate; and forming a molding compound on the first side of the substrate. The molding compound covers the flip chip die. The method further includes forming a heat sink on the molding compound; and forming a taping layer on a second side of the substrate, wherein the second side is opposite from the first side in a vertical direction. After forming the taping layer, the method further includes performing a pre-cut process and an etching process on the heat sink; and removing the taping layer.

15 Claims, 12 Drawing Sheets

METHOD FORMING A SEMICONDUCTOR PACKAGE DEVICE

CROSS REFERENCE TO RELATED APPLICATIONS

This application claims priority of Taiwan Patent Application No. 110131380, filed on Aug. 25, 2021, the entirety of which is incorporated by reference herein.

BACKGROUND

Technical Field

The present disclosure relates to a method forming a semiconductor package device, and in particular it relates to a method of protecting solder pads that are used for connecting solder balls.

Description of the Related Art

The semiconductor industry continues to improve the integration density of various electronic components (such as transistors, diodes, resistors, capacitors, etc.) by continual reductions in minimum feature size, which allow more components to be integrated into a given area. However, as the minimum features sizes are reduced, additional problems arise that should be addressed.

When more components are integrated into a given area, the demands for heat dissipation in operating devices also increase. A heat sink is additionally formed on a known semiconductor package device. However, materials of the heat sink are commonly selected from hard materials like metals, thereby increasing the difficulty on the singulation process. In order to overcome this new difficulty, other etching processes need to be performed before the singulation process, in which the etching processes may damage the metallic solder pads on the surface of the semiconductor package device. Therefore, the problem of damaging the surface of the semiconductor package device due to the etching processes needs to be addressed before increasing the heat dissipation of the semiconductor package device.

SUMMARY

In an embodiment, a method forming a semiconductor package device includes: providing a substrate; forming a flip chip die on a first side on the substrate; and forming a molding compound on the first side of the substrate. The molding compound covers the flip chip die. The method further includes forming a heat sink on the molding compound; and forming a taping layer on a second side of the substrate, wherein the second side is opposite from the first side in a vertical direction. After forming the taping layer, the method further includes performing a pre-cut process and an etching process on the heat sink; and removing the taping layer.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1A:
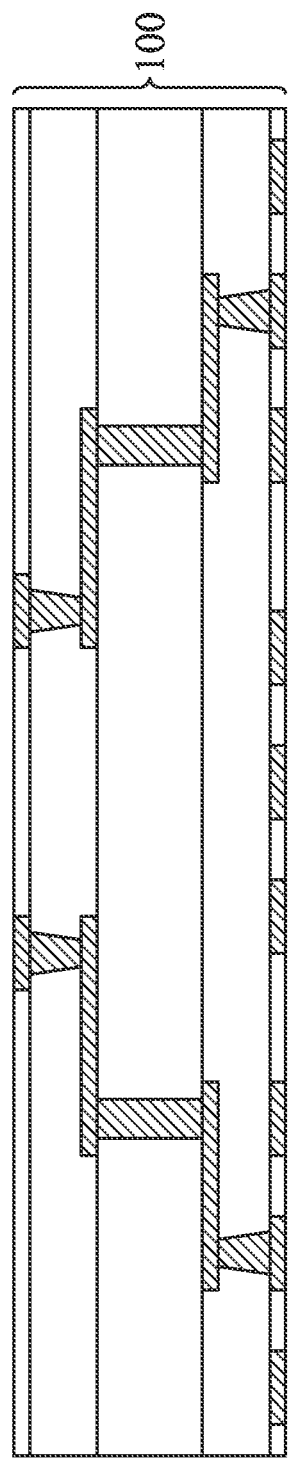
FIGS. 1A and 2-11 are cross-sectional views of various intermediate stages in manufacturing a semiconductor package device, according to some embodiments of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact. In addition, the present disclosure may repeat reference numerals and/or letters in the various examples. This repetition is for the purpose of simplicity and clarity, and does not in itself dictate a relationship between various embodiments and/or configuration discussed.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

Furthermore, spatially relative terms, such as "beneath," "below," "lower," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The terms "about," "approximately" and "substantially" as used herein typically mean±20% of the stated value, more typically ±10% of the stated value, more typically ±5% of the stated value, more typically ±3% of the stated value, more typically ±2% of the stated value, more typically ±1% of the stated value and even more typically ±0.5% of the stated value. The stated value of the present disclosure is an approximate value. That is, when there is no specific description of the terms "about," "approximately" and "substantially", the stated value includes the meaning of "about," "approximately" or "substantially".

Some embodiments of the present disclosure are described. Additional operations can be provided before, during, and/or after the stages described in these embodiments. Additional features can be added to the semiconductor device structure. Some of the features described below can be replaced or eliminated for different embodiments. Although some embodiments are discussed with operations performed in a particular order, these operations may be performed in another logical order.

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the prior art and will not be interpreted in an idealized or overly formal sense unless expressly so defined in the embodiments of the present disclosure.

In the semiconductor package device fabrication, a molding material may be used to cover all components (regardless of active components or passive components) on the chip surface for subsequent package operations. As the circuit feature size continues to reduce, and the integration density continues to increase, all operating components may experience over-heat issue. In response to the over-heat issue during device operation, a contemporary semiconductor package device (particularly a package device with a flip chip die) may add a heat sink on the molding compound. In general, materials of the heat sink are metal materials with high thermal conductivity, and have higher hardness in comparison with the molding material.

Embodiments of the present disclosure provide a method forming a semiconductor package device, which can be particularly applied to the protection of solder pads. Since the semiconductor package device needs to undergo a singulation process, the added heat sink also needs to be diced. However, due to the huge difference in the material characteristics (for example, hardness) between the heat sink and the molding material, it may be difficult to complete the singulation of the heat sink and the molding material simultaneously. Therefore, in the conventional method, a pre-cut process may be performed only on the heat sink before the original singulation process. Since the heat sink is in direct contact with the underlying molding material, the pre-cut process needs to be precisely controlled to avoid damage on the underlying molding material. Also, to avoid damage on the molding material, the pre-cut process normally cannot dice the heat sink thoroughly. Therefore, an etching process may then be performed to remove metal residues (which may be hairy-shape conducting elements) in the diced heat sink after the pre-cut process.

According to some embodiments, a wet etching process may be used to remove the metal residues. In other words, the entire semiconductor package device may be submerged into the etchants to remove the metal residues. However, besides removing the metal residues, the etchants may also damage metallic solder pads on another side of the semiconductor package device for soldering solder balls. The conventional devices adopt nickel-gold (NiAu) materials to form the solder pads, which can prevent undesirable effect caused by the etchants (for example, unable to form the solder balls on the metallic solder pads). However, specifying the metallic materials of the solder pads may cause excessive limitations on the entire manufacture. For example, there aren't many vendors that can supply the related materials.

In some embodiments of the present disclosure, a taping layer may be formed on the other side of the substrate before performing the pre-cut process on the heat sink, and the taping layer may be removed after completing the etching process. In this way, the metallic solder pads on the other side of the substrate may be protected by the taping layer from the etching process. Materials of the solder pads can thus adopt more types of metals or other conductive materials. In addition, the risk generated from the Galvanic effect may also be avoided. Generally, the design flexibility of the substrate of the semiconductor package device may be increased, while the fabrication process and the device operation qualities may also be enhanced.

FIGS. 1A and 2-11 are cross-sectional views of various intermediate stages in manufacturing a semiconductor package device 10, according to some embodiments of the present disclosure. In the present embodiments, the semiconductor package device 10 includes forming a flip chip die, a molding compound, and a heat sink on one side of the substrate, and forming the solder balls on another side of the substrate. It should be noted that, elements shown in FIGS. 1A and 2-11 are illustrative, and are not intended to be limiting. As shown in FIG. 1A, a substrate 100 may initially be provided.

Still referring to FIG. 1A, the substrate 100 may be a laminated plate. For example, a plurality of metal layers and dielectric layers may be alternately arranged within the substrate 100, with vias penetrating the dielectric layers to couple each metal layer. In some embodiments, one of the surfaces of the substrate 100 is used to connect the flip chip die, while another surface is used to form the solder balls. According to some embodiments of the present disclosure, the opposing surfaces of the substrate 100 both have metal layers. Upon design, a portion of the metal layer on each surface may be covered by a solder mask, while another portion of the metal layer not covered by the solder mask is covered by a thin film of an organic solderability preservative (OSP).

Figure 1B:
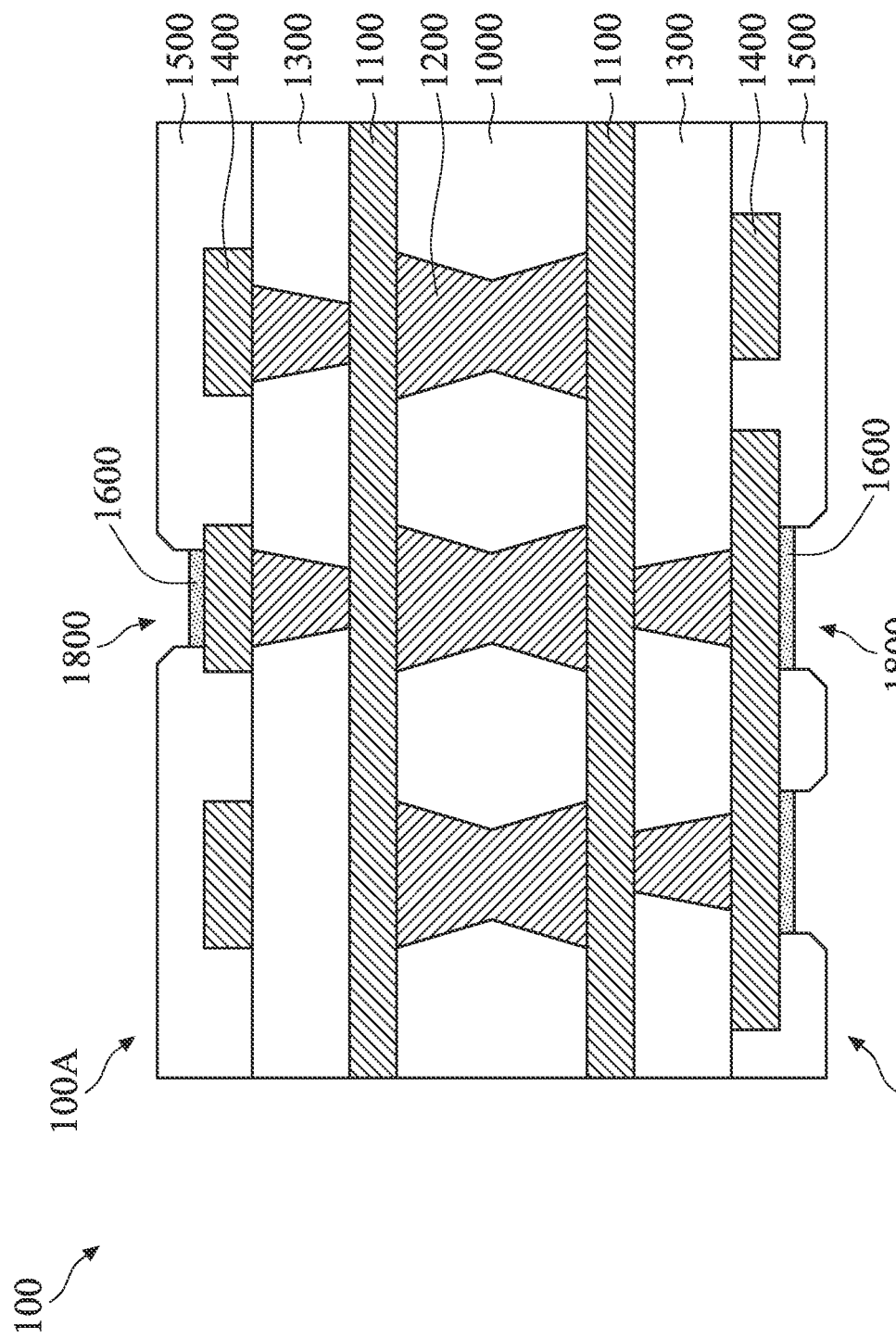
FIG. 1B illustrates an enlarged view of the structure shown in FIG. 1A, according to some embodiments of the present disclosure.

FIG. 1B illustrates an enlarged view of the substrate 100 shown in FIG. 1A, according to some embodiments of the present disclosure. The substrate 100 includes a first side 100A and a second side 100B, wherein the first side 100A and the second side 100B are two opposing sides of the substrate 100 in a vertical direction. According to some embodiments of the present disclosure, the first side 100A is used to connect a flip chip die, while the second side 100B is used to form the solder balls. According to some embodiments, the substrate 100 includes a core 1000 located at the central position of the substrate 100. The core 1000 may be a single layer or a composite structure formed by multiple layers (not shown). The thickness of the core 1000 may be approximately between 60 μm and 400 μm, for example, approximately between 100 μm and 200 μm. In some embodiments, the core 1000 may include suitable insulating or dielectric materials. For example, materials of the core 1000 may include glass epoxy, bismaleimide triazine (BT), Ajinomoto build-up film (ABF), the like, or combinations thereof. In other embodiments, the core 1000 may be fiber-enhanced glass epoxy.

Still referring to FIG. 1B, through-holes may be formed penetrating the core 1000 using laser drill method. Next, metal materials may be deposited on the opposing surfaces of the core 1000 in the vertical direction. In some embodiments, the metal materials may be deposited using physical vapor deposition (PVD), atomic layer deposition (ALD), plating, the like, or combinations thereof. The metal materials on opposing surfaces of the core 1000 become inner metal layers 1100. In addition, the metal materials are also filled into the through-holes penetrating the core 1000, forming vias 1200. In some embodiments, the vias 1200 may couple the inner metal layers 1100 on the opposing surfaces of the core 1000. The thickness of the inner metal layers 1100 may be approximately between 15 μm and 29 μm, for example, approximately between 20 μm and 24 μm. The width of the vias 1200 may be approximately between 85 μm and 105 μm, for example, approximately between 90 μm and 100 μm. The metal materials may include cobalt (Co), ruthenium (Ru), aluminum (Al), tungsten (W), copper (Cu), titanium (Ti), tantalum (Ta), silver (Ag), gold (Au), nickel (Ni), the like, combinations thereof, or multiple layers thereof.

Referring to FIG. 1B, adhesive layers 1300 may be formed on the opposing inner metal layers 1100. The function of each of the adhesive layers 1300 is to adhere two metal layers, for example, the inner metal layer 1100 and an outer metal layer 1400 (described in detail below), while the two adhered metal layers remains separated. The adhesive layers 1300 may be sheet based materials including resin compositions. According to some embodiments of the present disclosure, the adhesive layers 1300 are pre-impregnated (pre-preg, PP) fiber glass, thus the adhesive layers 1300 may also be referred to as pre-impregnated (PP) layers. The thickness of the adhesive layers 1300 may be approximately between 25 μm and 55 μm, for example, approximately between 30 μm and 50 μm. The adhesive layers 1300 may be formed on the opposing inner metal layers 1100 in the vertical direction by laminated methods.

For example, materials of the adhesive layers 1300 may include bisphenol A type epoxy resin, bisphenol F type epoxy resin, bisphenol S type epoxy resin, phenol novolac type epoxy resin, alkylphenol novolac type epoxy resin, biphenyl type epoxy resin, aralkyl type epoxy resin, dicyclopentadiene type epoxy resin, naphthalene type epoxy resin, naphthol type epoxy resin, biphenyl aralkyl type epoxy resin, fluorene type epoxy resin, xanthene type epoxy resin, triglycidyl isocyanurate (TGIC), the like, or combinations thereof. The adhesive layers 1300 may be formed by spin-on coating, chemical vapor deposition (CVD), atomic layer deposition, high-density plasma chemical vapor deposition (HDP-CVD), plasma-enhanced chemical vapor deposition (PECVD), flowable chemical vapor deposition (FCVD), sub-atmospheric chemical vapor deposition (SACVD), the like, or combinations thereof.

Still referring to FIG. 1B, the through-holes may be formed penetrating the adhesive layers 1300 using the above mentioned laser drill method. Next, the metal materials are deposited on the surfaces of the opposing adhesive layers 1300 in the vertical direction. In some embodiments, the metal materials may be deposited using physical vapor deposition, atomic layer deposition, plating, the like, or combinations thereof. The metal materials on the surfaces of the adhesive layers 1300 becomes the outer metal layers 1400. In addition, the metal materials may also be filled into the through-holes penetrating the adhesive layers 1300 and become the vias 1200. In some embodiments, the vias 1200 in each of the adhesive layers 1300 may couple one of the inner metal layers 1100 and one of the outer metal layers 1400. The thickness of the outer metal layers 1400 may be approximately between 13 μm and 25 μm, for example, approximately between 15 μm and 23 μm. Materials of the outer metal layers 1400 may be similar with those of the inner metal layers 1000, and the details are not described again herein to avoid repetition. In some embodiments, the outer metal layers 1400 may be optionally patterned.

Referring to FIG. 1B, a solder mask material may be coated on the surfaces of opposing adhesive layers 1300 in the vertical direction, in which the solder mask material covers the patterned outer metal layers 1400. The solder mask material may be laminated or screen printed layers formed on the first side 100A and the second side 100B. In some embodiments, the solder mask material is an electrically insulated and low surface-stress material. According to some embodiments of the present disclosure, the solder mask material may be patterned to form a solder mask 1500. In some embodiments, patterned openings 1800 may be formed in the solder mask material using the lithography process (for example, resist layer coating, soft baking, exposure, post-exposure baking, development, the like, or combinations thereof), the etching process (for example, wet etching process, dry etching process, the like, or combinations thereof), the like, or combinations thereof. The solder mask 1500 is used to protect a portion of the outer metal layers 1400 from subsequent soldering and/or plating procedure that may result in short circuitry. A portion of the outer metal layers 1400 exposed through the patterned openings 1800 may correspond to metal pads that will be subsequently used to electrically connect the flip chip die (on the first side 100A) and the solder balls (on the second side 100B). Since the solder mask 1500 needs to cover the outer metal layers 1400, the thickness of the solder mask 1500 inherently needs to be higher than the thickness of the outer metal layers 1400. The thickness of the solder mask 1500 may be approximately between 10 μm and 22 μm, for example, approximately between 12 μm and 20 μm.

Still referring to FIG. 1B, an organic solderability preservative films 1600 may be deposited on the portion of the outer metal layers 1400 exposed through the patterned openings 1800. In some embodiments, the organic solderability preservative films 1600 may protect the outer metal layers 1400 from contacting air until the soldering procedure. Furthermore, the organic solderability preservative films 1600 may be readily removed by a soldering flux and a dilute acid to expose a clean metallic surface for soldering. The organic solderability preservative films 1600 are adhered to the metallic surface by forming a coordination bond with the metal atoms. The organic solderability preservative films 1600 may be water-based organic compound. For example, materials of the organic solderability preservative films 1600 may be selected from the azole group, including benzotriazoles, imidazoles, benzimidazoles, the like, or combinations thereof. If the thickness of the organic solderability preservative films 1600 were too thin, the films may be breached, causing the metallic surface to be in contact with air, resulting in oxidation or sulfuration. If the thickness of the organic solderability preservative films 1600 were too thick, a stronger soldering flux is needed subsequently for removal to perform soldering. The thickness of the organic solderability preservative films 1600 may be approximately between 0.2 μm and 0.5 μm, for example, approximately between 0.3 μm and 0.4 μm.

Initially, an acid cleaner may be used on the exposed metallic surface. The acid cleaner may remove oxides, fingerprint, grease, or the like that may generated in the previous process, cleaning the metallic surface. Then, a micro-etch may be performed to remove more serious oxides to generate a slightly rough metallic surface with uniform brightness, so the subsequently formed organic solderability preservative films 1600 may be more delicate and uniform. Next, an acid rinse may be performed to completely remove residues on the metallic surface after the micro-etch to ensure the cleanliness of the metallic surface. Then, the organic solderability preservative films 1600 may be coated on the clean metallic surface. After that, a baking may be performed after coating the organic solderability preservative films 1600 on the clean metallic surface to maintain the dryness of the organic solderability preservative films 1600.

After completing the organic solderability preservative films 1600, the outer metal layers 1400 of the first side 100A and the second side 100B of the substrate 100 are both completely covered to avoid contact with air and affecting the subsequent process. In some mbodiments, the solder mask 1500 may cover the portion of the outer metal layer 1400 of the first side 100A not needed to form the flip chip die, and the portion of the outer metal layer 1400 of the second side 100B not needed to solder solder balls. In other words, the portion of the outer metal layer 1400 of the first side 100A needed to form the flip chip die and the portion of the outer metal layer 1400 of the second side 100B needed to solder solder balls are exposed through the patterned openings 1800, and then protected by the organic solderability preservative films 1600 that can be readily removed, until a related process needs to be performed. After the formation of the organic solderability preservative films 1600, the predetermined structure of the substrate 100 is completed, and the manufacture of the semiconductor package device of the present application may begin.

Figure 2:
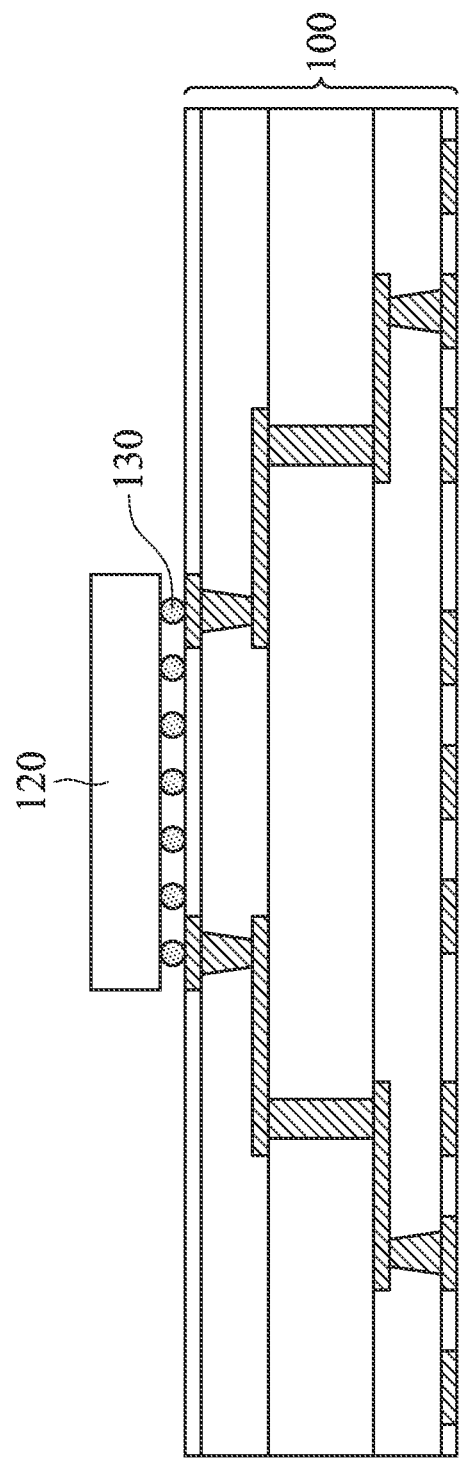

Referring to FIG. 2, a flip chip die 120 is connected on the first side 100A of the substrate 100. In some embodiments, the flip chip die 120 may include active components or passive components. The active components includes metal-oxide semiconductor (MOS) transistors, complementary metal-oxide semiconductor (CMOS) transistors, lateral-diffused metal-oxide semiconductor (LDMOS) transistors, bipolar complementary metal oxide semiconductor—double diffused metal oxide semiconductor (BCD) transistors, planar transistors, fin field-effect transistors (finFET), gate-all-around (GAA) field-effect transistors, the like, or the combinations thereof. The passive components include metal lines, inductors, resistors, diodes, bonding pads, or the like. For simplicity, the details of the flip chip die 120 are not illustrated herein.

Because the front end of the chip may be "flipped" in order to connect to the first side 100A of the substrate 100, thus it is referred to as the flip chip die 120. The conventional process may connect the chip's bonding pads to the package device's bonding pads through wire bonding, but the excessively long metal wires may increase the inductance between components. Different from interconnecting the package substrate and the chip using wire bonding, a plurality of pillars 130 may be formed on the front end of the chip of the present application, and under some circumstances, the plurality of pillars 130 may also be referred to as bumps. Next, the plurality of pillars 130 may be soldered onto the first side 100A of the substrate 100, especially onto the portion of the outer metal layer 1400 of the first side 100A exposed through the patterned openings 1800. Since the bonding wires are omitted, the locations of bonding pads may be distributed throughout the chip surface, instead of concentrating at the die periphery. Furthermore, the dimension of the die and the configuration of the circuits may have higher flexibility, while the performance of the overall structure may be optimized. Such process may be referred to as the surface mount technology (SMT).

In some embodiments, the plurality of pillars 130 may include a metal layer, a capping layer, and a solder region sequentially formed on the top of the front end of the flip chip die 120. The bottom area of the plurality of pillars 130 may be circular or elliptical, and the diameter of which may be approximately between 40 μm and 80 μm, for example, approximately between 60 μm and 70 μm. The height of the plurality of pillars 130 may be approximately between 50 μm and 65 μm, for example, approximately between 58 μm and 62 μm. The metal layer may be pillar-shape with straight sidewall, and the materials of which may include copper or copper alloy. The capping layer may include nickel, palladium (Pd), the like, or combinations thereof. Materials of the solder region may include tin silver alloy, tin silver copper alloy, the like, or combinations thereof. According to some embodiments of the present disclosure, the solder region may be reflowed using a reflow process (for example, convective reflow process, laser reflow process, or the like). After the reflow process, the solder region may have rounded surface. It should be noted that, in the bonding process, the solder region of the plurality of pillars 130 may be in direct contact with the portion of the outer metal layer 1400 of the first side 100A exposed through the patterned openings 1800.

Figure 3:
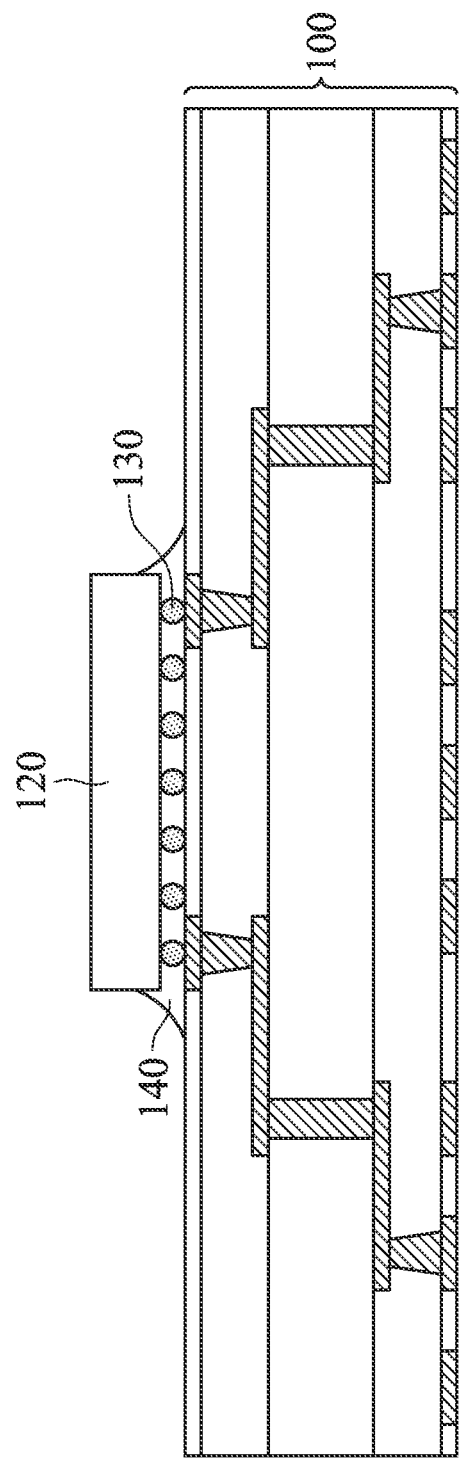

Referring to FIG. 3, an underfill 140 may be injected to infiltrate the space between the flip chip die 120 and the substrate 100 through the glue dispensing method. In some embodiments, the underfill 140 may contact and surround the plurality of pillars 130. The underfill 140 may be cured to further secure the flip chip die 120 and the plurality of pillars 130 on the first side 100A of the substrate 100. In some embodiments, the underfill 140 may overflow beyond the space between the flip chip die 120 and the substrate 100, and surround a portion of the peripheral sidewall of the flip chip die 120 to strengthen the fixation of the flip chip die 120. Materials of the underfill 140 may include epoxy and silica gel.

Figure 4:
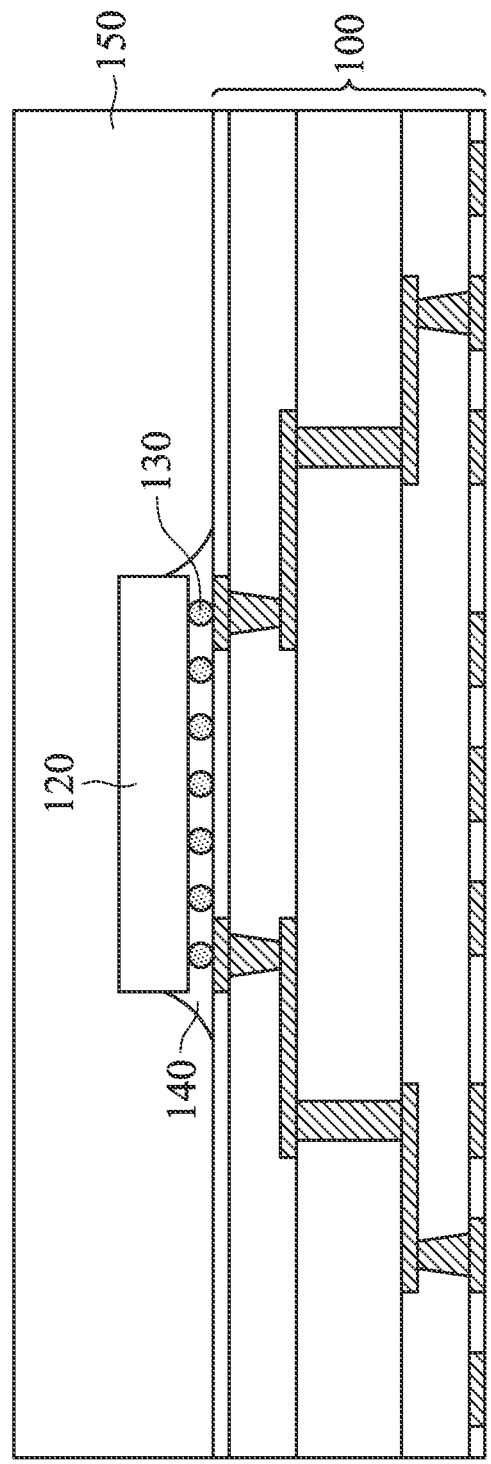

Referring to FIG. 4, a molding compound 150 may be formed on the first side 100A of the substrate 100. In some embodiments, the molding compound 150 covers the flip chip die 120 and the underfill 140. The molding compound 150 may protect the flip chip die 120 from the mechanical stress for subsequent operations. Furthermore, the molding compound 150 may form planarized top surface by a planarization process (for example, chemical mechanical polish (CMP) process), in which the top surface may be used to perform marking for identification. The molding compound 150 may be formed using hot press, compression, or injection methods. The height of the molding compound 150 may be approximately between 300 μm and 500 μm, for example, approximately between 350 μm and 480 μm. Materials of the molding compound 150 may generally be plastic composites, including epoxy, phenol hardeners, silica, catalyst, pigment, or mold release agents.

Figure 5:
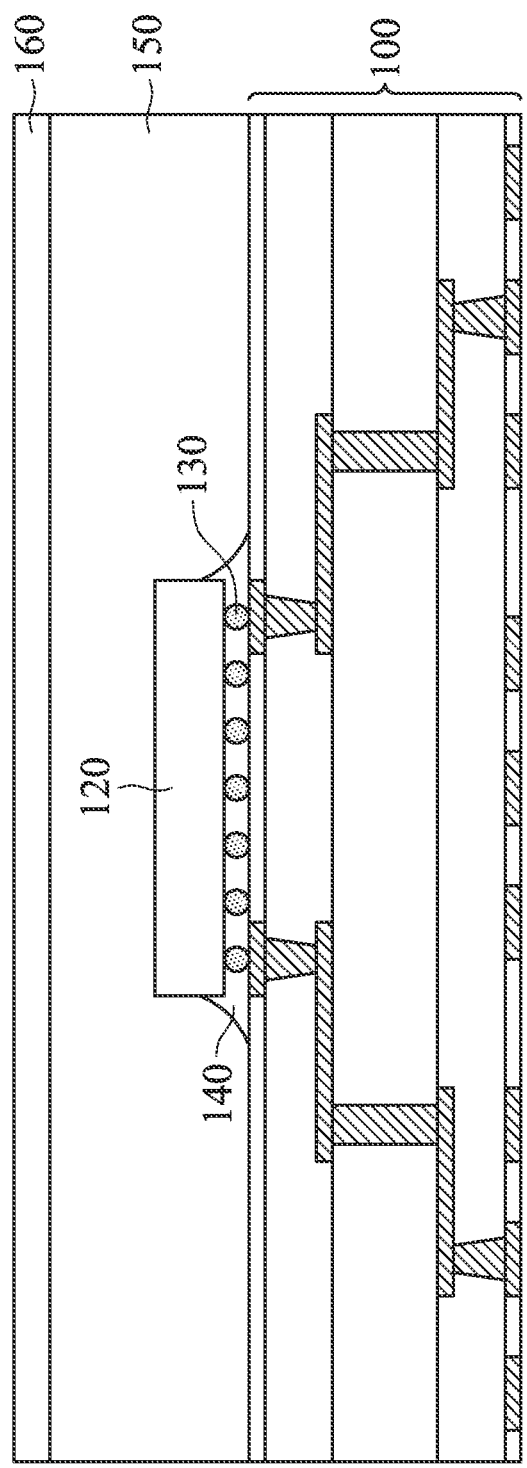

Referring to FIG. 5, a heat sink 160 may be formed on the planarized top surface of the molding compound 150. According to some embodiments of the present disclosure, the heat sink 160 may dissipate heat generated from operating the flip chip die 120. In some embodiments, the surface of the heat sink 160 may also be used to perform marking for identification. The heat sink 160 may be deposited using physical vapor deposition, atomic layer deposition, plating, the like, or combinations thereof. The thickness of the heat sink 160 may be approximately between 0.11 μm and 0.15 μm, for example, approximately between 0.12 μm and 0.14 μm. Materials of the heat sink 160 may include any materials with thermal conductivity, such as metal materials. Since the thermal conductivity coefficients of the metal materials may be 400 to 500 times higher than that of the plastic materials, disposing the heat sink 160 of the metal materials in the device of continual increase of integrity density is necessary. However, the heat sink 160 of the metal materials has higher hardness than the molding compound 150 of the plastic materials, and in the singulation process, it is very difficult to perform dicing on the molding compound 150 and the heat sink 160 simultaneously.

In the known fabrication, the pre-cut process may be performed after forming the heat sink 160, to sever the heat sink 160 at the location corresponding to the subsequent singulation. In comparison with dicing the plastic materials, dicing the heat sink 160 may require using stronger energy and harder tools. It should be noted that, the heat sink is formed directly above the molding compound 150, and the molding compound 150 is in direct contact with the heat sink 160. If the parameter settings of the dicing process of the heat sink 160 are too high, the molding compound 150 directly below may be damaged. Therefore, in order to avoid damaging the molding compound 150, the pre-cut process on the heat sink 160 may not form clean dicing streets.

Metal residues may be easily formed on sidewalls of the dicing street of the heat sink 160, and additional etching process is required to remove the metal residues. In general, the etching process is wet etching process, in which the entire semiconductor package device is submerged into the etchants of acidic solution. Besides removing the metal residues, the etchants may also damage the outer metal layer 1400 of the other side (for example, the second side 100B) of the substrate 100, and the organic solderability preservative film 1600 may not protect the outer metal layer 1400 from the etchants. In order to minimize the effect of the etching process on the outer metal layer 1400 of the second side 100B, the known fabrication may form the outer metal layer 1400 with nickel-gold materials, which will be subsequently used for forming solder balls. However, limiting the materials of the outer metal layer 1400 of the second side 100B may impose too many limitations on the entire manufacturing process. For example, there aren't many vendors that can supply the related materials.

The Galvanic effect occurs when a material coupled with two different metallic elements (for example, nickel and gold) is submerged into an etching solution, one of the coupled metallic elements may serve as anode, while the other of the metallic elements may serve as cathode. The anode metallic element may corrode at a rate higher than the same metallic element before coupling. In contrast, the cathode metallic element may corrode at a rate lower than the same metallic element before coupling. The driving force may be formed by the electrical potential difference between the two metallic elements to result in different corrosion situations. The metallic element that corrodes faster may degrade the performance of the overall material, which in turn affects the stability of the solder balls.

Figure 6:
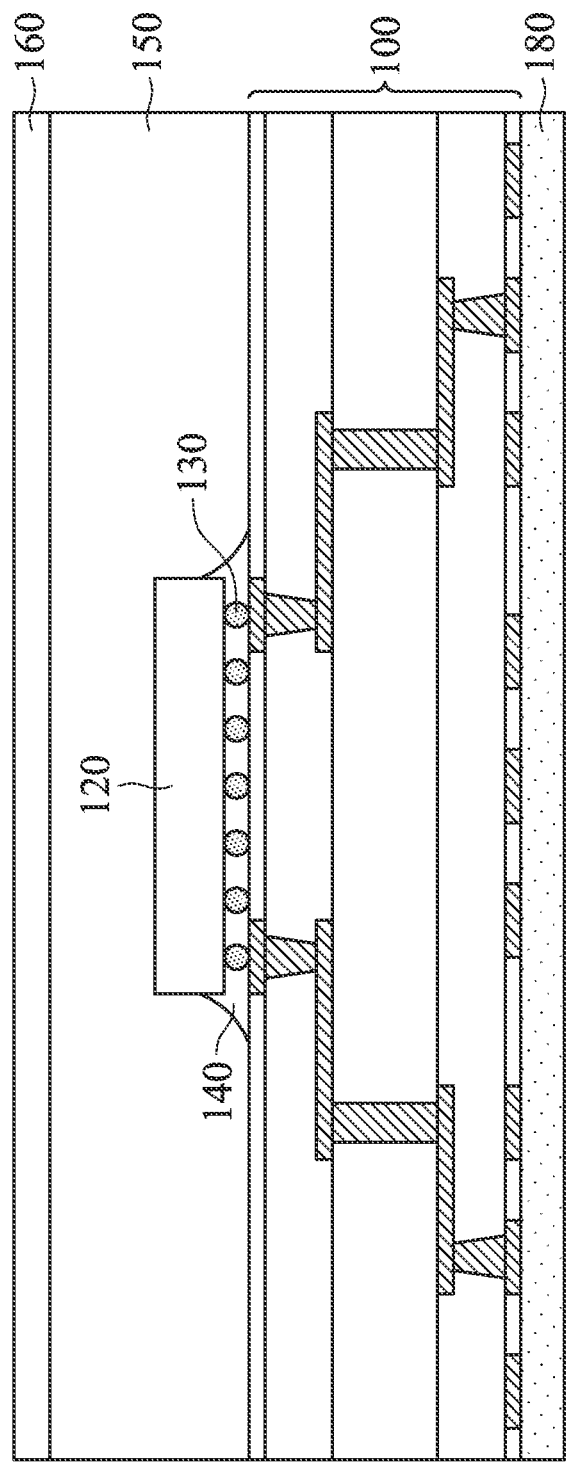

The inventor of the present application has proposed a method to protect the metal layer used for forming the solder balls from the etching process on the heat sink 160. Referring to FIG. 6, a taping layer 180 is formed on the second side 100B of the substrate 100. Materials of the taping layer 180 may include polyimide (PI), polyamide (PA), the like, or combinations thereof. The thickness of the taping layer 180 may be approximately between 100 μm and 150 μm, for example, approximately between 120 μm and 140 μm. The taping layer 180 may be formed by spin-on coating, chemical vapor deposition, atomic layer deposition, high-density plasma chemical vapor deposition, plasma-enhanced chemical vapor deposition, flowable chemical vapor deposition, sub-atmospheric chemical vapor deposition, the like, or combinations thereof.

The taping layer 180 may isolate the portion of the outer metal layer 1400 of the second side 100B exposed through the patterned openings 1800 from the etchants of the etching process on the heat sink 160, thereby protecting the outer metal layer 1400 from damage by the etching process. In addition, since the taping layer 180 can provide a stronger protection for the outer metal layer 1400 of the second side 100B than the organic solderability preservative film 1600, materials of the outer metal layer 1400 would not be limited to nickel-gold materials. Any metal materials may be used to form the outer metal layer 1400 of the second side 100B. Furthermore, when the outer metal layer 1400 of the second side 100B does not contact the etchants, the Galvanic effect may have minimal influence.

Figure 7:
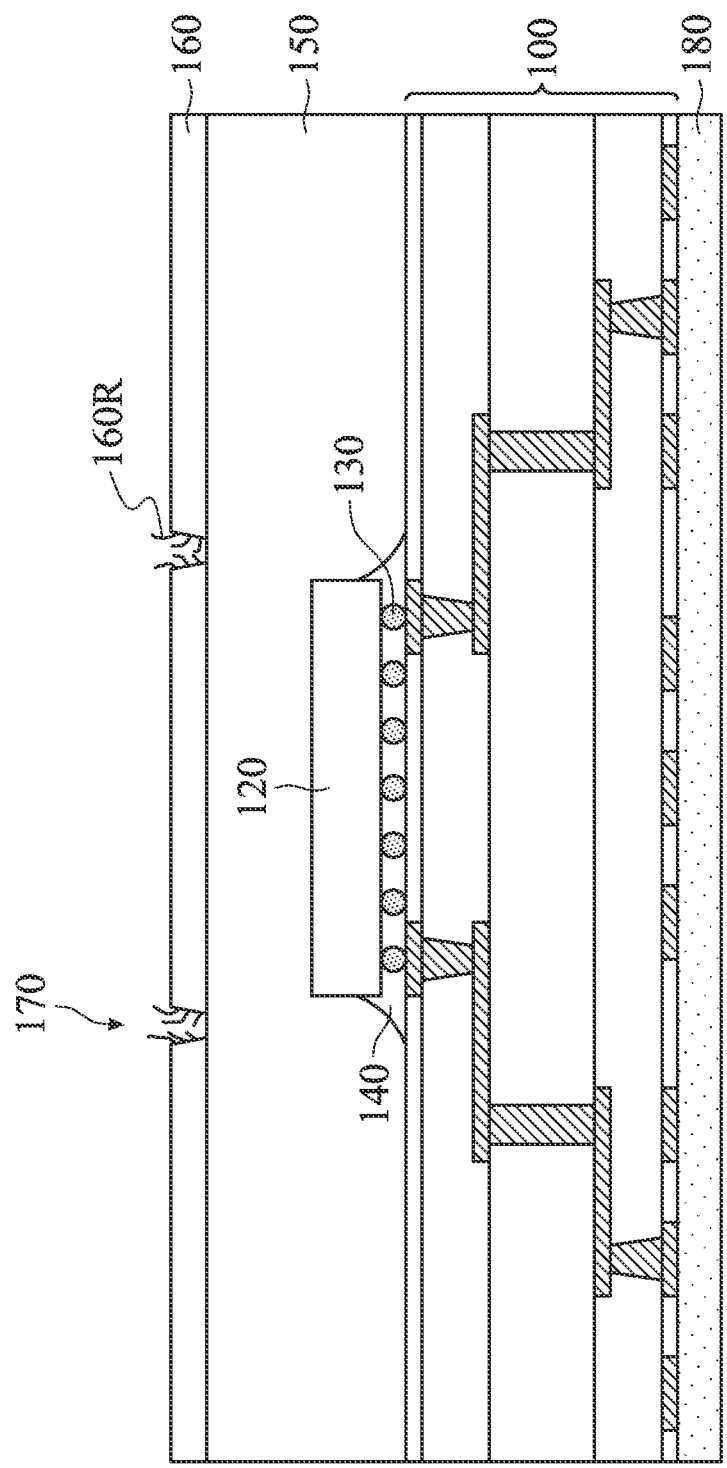

Referring to FIG. 7, after forming the taping layer 180 on the second side 100B of the substrate 100, a pre-cut process may be performed on the heat sink 160. The pre-cut process may sever the predetermined portion of the heat sink 160 in advance, in which the predetermined portion corresponds to the location that is to be singulated. As mentioned previously, there is a huge difference on the material hardness between the heat sink 160 and the molding compound 150, making it difficult for the singulation process to be performed simultaneously. In some embodiments, the pre-cut process may be a partial pre-cut, in which the portion of the heat sink away from the molding compound 150 is severed, while the portion close to the molding compound 150 is not severed. In other embodiments, the pre-cut process may be a full pre-cut, in which the heat sink 160 is completely severed through. Those skilled in the art may select the appropriate pre-cut method in conjunction with the subsequent etching process. The pre-cut process may be performed using laser or blades. After completing the pre-cut process, a plurality of dicing openings 170 may be formed in the heat sink 160. Since the plurality of dicing openings 170 may correspond to the location to be singulated, the plurality of dicing openings 170 may be a single grid structure from a top view. In order to avoid damaging the underlying molding compound 150, the parameter settings of the pre-cut process may not be too high, resulting in metal residues 160R forming on the dicing surface of the plurality of dicing openings 170. According to some embodiments of the present disclosure, the metal residues 160R may be hairy-shape conducting elements, which rely on the etching process to remove, in order to prevent short-circuitry in subsequent processes.

Figure 8:
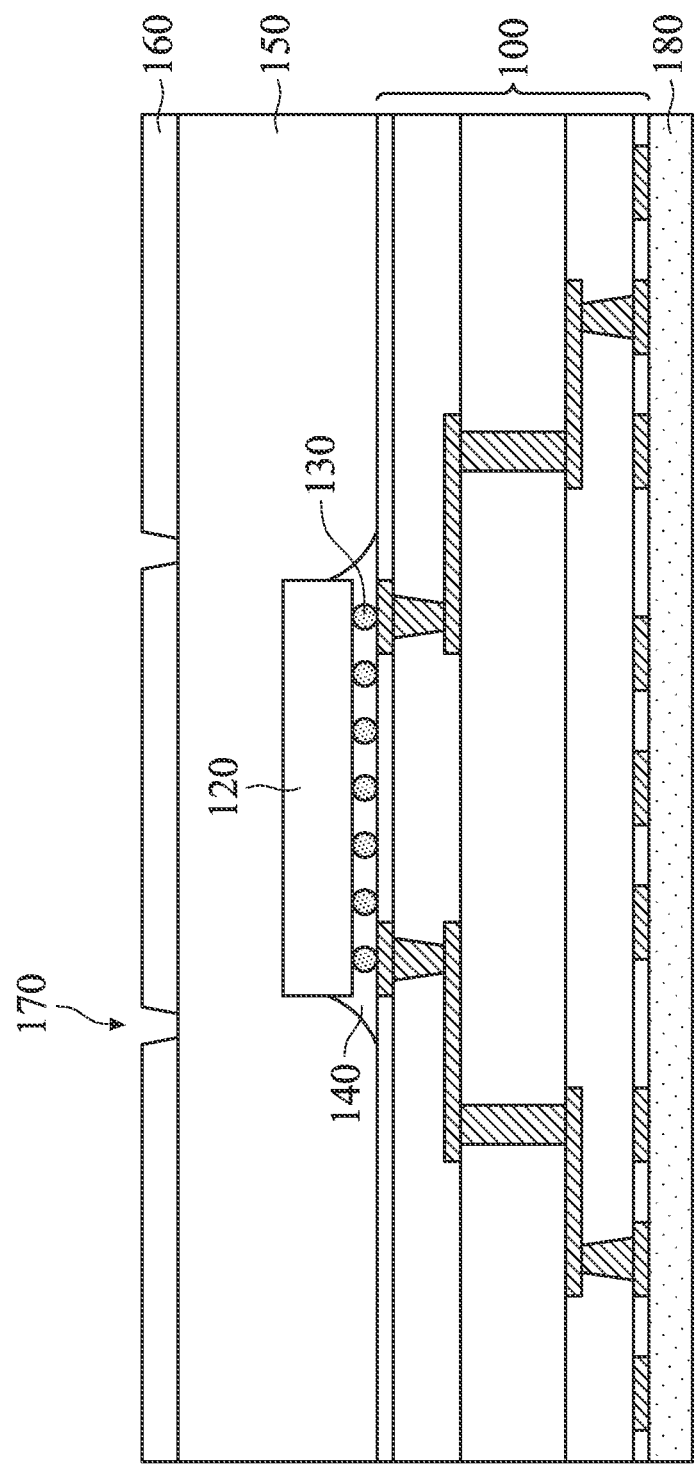

Referring to FIG. 8, an etching process may be performed on the heat sink 160 after completing the pre-cut process. The etching process may remove the metal residues 160R remaining within the plurality of dicing openings 170, thereby generating clean dicing openings 170. In the known fabrication, since the molding compound 150 is disposed on the first side 100A of the substrate 100, the outer metal layer 1400 of the first side 100A is not in contact with the etchants. The taping layer 180 of the present application covers the second side 100B of the substrate 100, thus the outer metal layer 1400 of the second side 100B is also not in contact with the etchants. Since the taping layer 180 can provide effective protection, materials of the outer metal layer 1400 are not limited to nickel-gold materials, but any metal materials may be selected. Furthermore, when the outer metal layer 1400 of the second side 100B is not in contact with the etchants, the Galvanic effect may have minimal influence. As described above, the etching process may be wet etching process, in which the entire semiconductor package device is submerged into the etchants of acidic solution. The etchant chemicals may include sulfuric acid ($H_2SO_4$), hydrochloric acid (HCl), hydrogen bromide (HBr), ammonia ($NH_3$), or combinations thereof. The chemical solvent includes de-ionized (DI) water, alcohol, acetone, the like, or combinations thereof.

Figure 9:
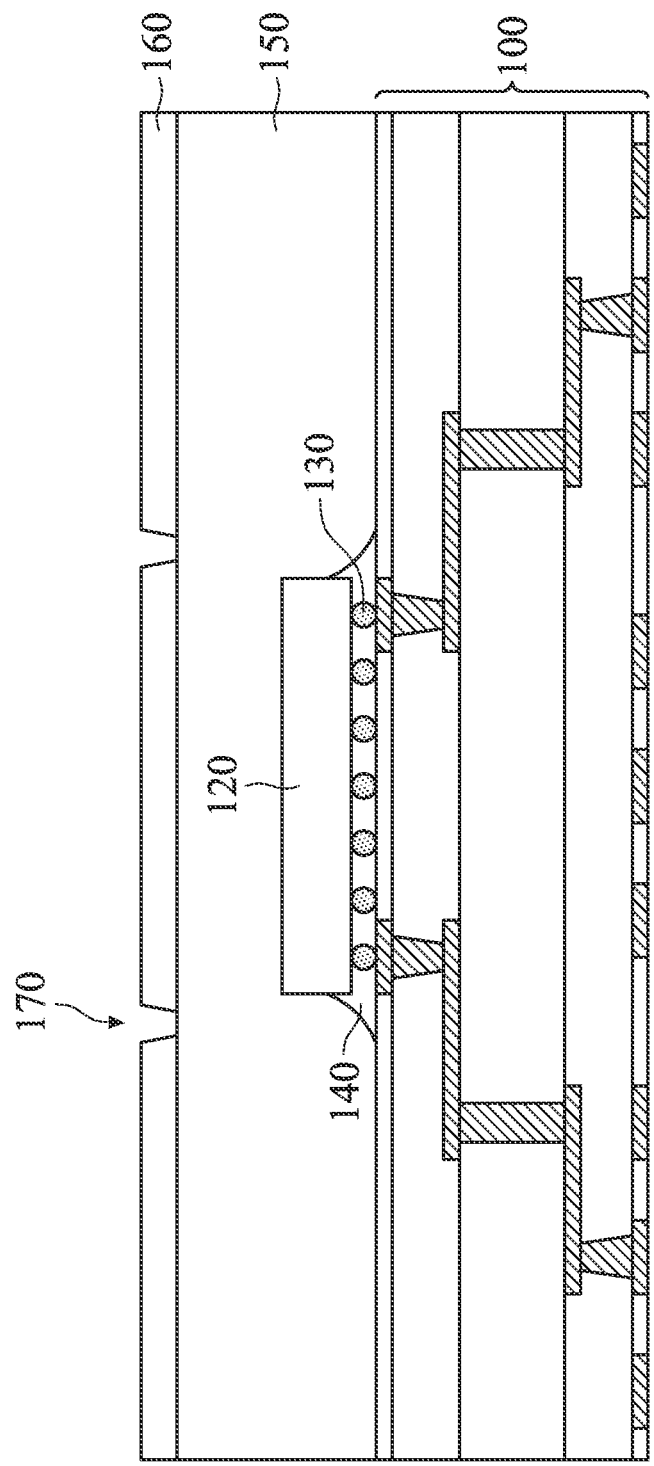

Referring to FIG. 9, a de-taping may be performed on the taping layer 180 after completing the etching process. Since the purpose of the taping layer 180 is to protect the outer metal layer 1400 of the second side 100B from the etching process, the taping layer 180 needs to be removed for subsequent processes. Appropriate chemicals or appropriate heating methods may be used to lower the adhesion of the taping layer 180, under the condition that the remaining structure of the semiconductor package device is not affected. After that, the taping layer 180 may be stripped away from the second side 100B of the substrate 100.

Figure 10:
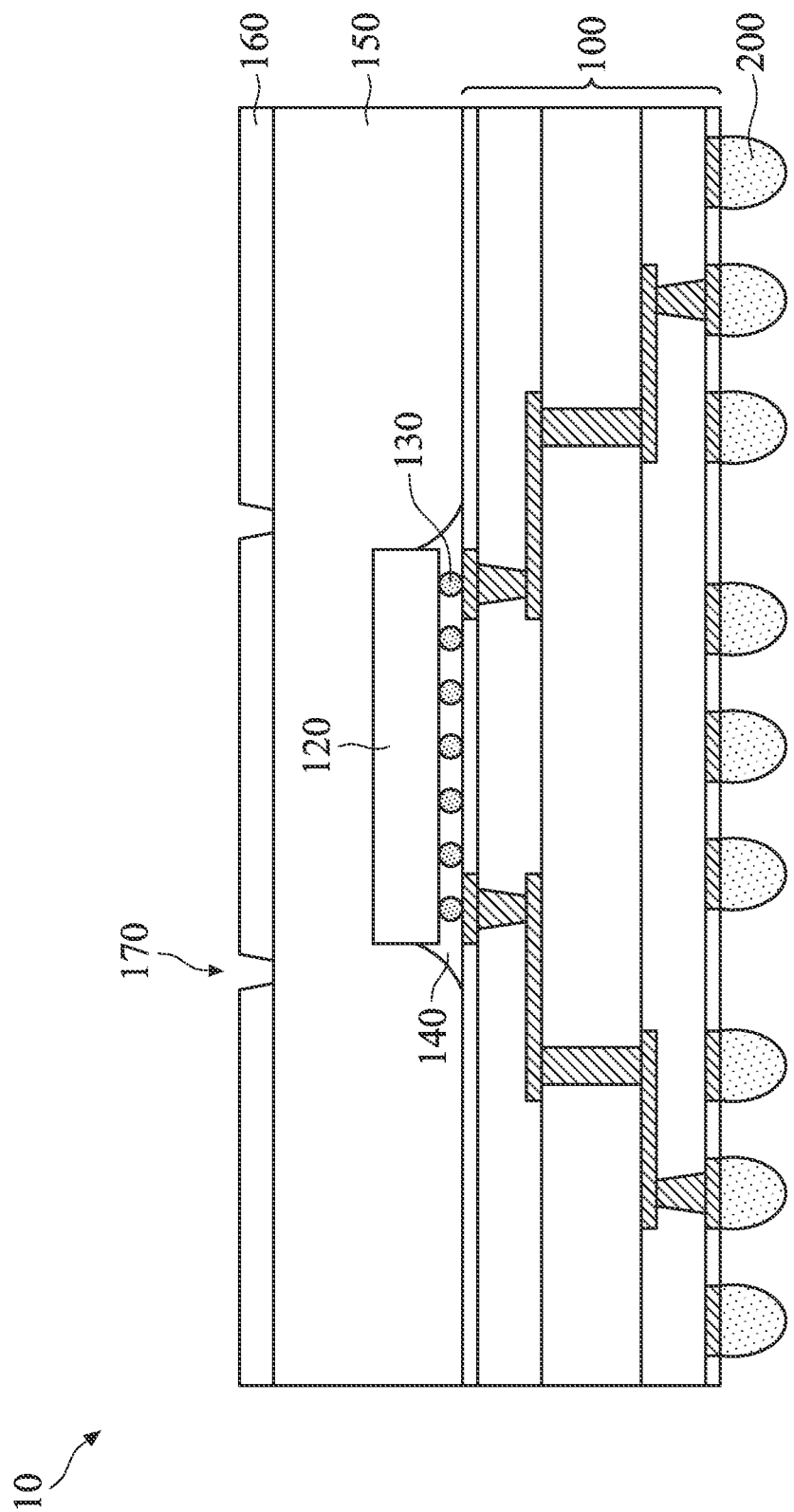

Referring to FIG. 10, when the second side 100B of the substrate 100 is exposed, a plurality of solder balls 200 may be formed on the portion of the outer metal layer 1400 exposed through the patterned openings 1800. In some embodiments, the solder balls 200 may also be referred to as "solder bumps". The plurality of solder balls 200 may be arranged into a ball grid array (BGA), which serves to connect the semiconductor package device with other components, such as a printed circuit board (PCB). The plurality of solder balls 200 may be thermally bonded onto the outer metal layer 1400 of the second side 100B using a bonding equipment, followed by a reflow process. After the reflow process is completed, the diameter of the plurality of solder balls 200 may be approximately between 250 μm and 500 μm, for example, approximately between 300 μm and 400 μm. The plurality of solder balls 200 may be made of any suitable metal material. In other embodiments, before bonding the plurality of solder balls 200, a barrier metallic layer may be formed on the outer metal layer 1400 to increase the adhesion strength between the plurality of solder balls 200 and the outer metal layer 1400.

After forming the plurality of solder balls 200, the manufacture of the semiconductor package device 10 is completed. As described above, the semiconductor package device 10 may be connected to the printed circuit board through the plurality of solder balls 200. The printed circuit board may be installed into many electronic products. Because the outer metal layer 1400 of the second side 100B is under effective protection, the plurality of solder balls 200 formed on the outer metal layer 1400 may provide a more reliable electrical connection between the semiconductor package device 10 and the printed circuit board.

Figure 11:
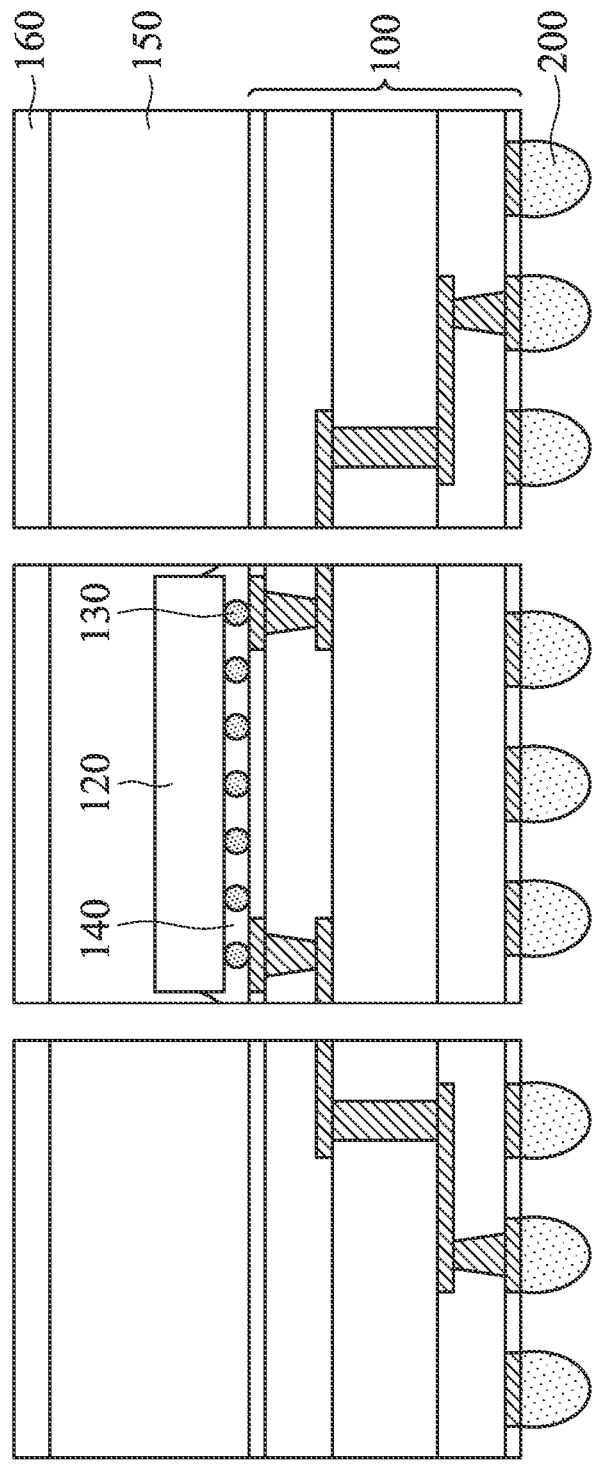

Referring to FIG. 11, the singulation process may be performed on the semiconductor package device 10. According to some embodiments of the present disclosure, the singulation process may begin at the second side 100B. As mentioned above, the plurality of dicing openings 170 in the heat sink 160 correspond with the locations of the semiconductor package device 10 to be singulated, which may be singulated dicing street or scribe line. The singulated dicing street/scribe line on the second side 100B and the plurality of dicing openings 170 on the opposite surface are sure to be consistent due to the alignment detection method. In some embodiments, the disposition of the dicing street/scribe line may avoid important features of the semiconductor package device 10, such as the flip chip die 120. In the embodiments where the dicing street is used, the width of the dicing street may be approximately between 0.25 μm and 0.35 μm, for example, approximately between 0.28 μm and 0.32 μm. The singulation process may be performed by saw, plasma etching, laser, the like, or combinations thereof. The singulated components may then be used for subsequent processes.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method forming a semiconductor package device, comprising:
providing a substrate;
forming a flip chip die on a first side of the substrate;
forming a molding compound on the first side of the substrate, wherein the molding compound covers the flip chip die;
forming a heat sink on the molding compound;
forming a taping layer on a second side of the substrate, wherein the second side is opposite from the first side in a vertical direction;
performing a pre-cut process and an etching process on the heat sink after forming the taping layer; and
removing the taping layer.

2. The method of claim 1, wherein the flip chip die is connected to the substrate through a plurality of pillars.

3. The method of claim 2, further comprising injecting an underfill between the substrate and the flip chip die, and surrounding the plurality of pillars.

4. The method of claim 1, wherein forming the molding compound comprises planarizing a top surface of the molding compound.

5. The method of claim 1, wherein each of the first side and the second side of the substrate further comprising:
an outer metal layer;
a solder mask covering the outer metal layer; and
an organic solderability preservative (OSP) covering the outer metal layer.

6. The method of claim 5, further comprising patterning the solder mask to form patterned openings, wherein the outer metal layer is exposed through the patterned openings.

7. The method of claim 6, wherein the organic solderability preservative is in direct contact with a portion of the outer metal layer exposed through the patterned openings.

8. The method of claim 1, wherein performing the pre-cut process on the heat sink to form a plurality of dicing openings in the heat sink.

9. The method of claim 1, wherein metal residues are generated in the plurality of dicing openings after performing the pre-cut process.

10. The method of claim 1, wherein the etching process is a wet etching process.

11. The method of claim 9, wherein performing the etching process to remove the metal residues.

12. The method of claim 1, wherein the taping layer isolates the second side of the substrate from chemicals used in the etching process.

13. The method of claim 1, wherein the taping layer is removed after completing the etching process.

14. The method of claim 1, further comprising forming a plurality of solder balls on the second side of the substrate after removing the taping layer.

15. The method of claim 14, further comprising performing a singulation process on the semiconductor package device after forming the plurality of solder balls.

* * * * *